United States Patent [19]
Bosiers et al.

[11] Patent Number: 5,856,846
[45] Date of Patent: Jan. 5, 1999

[54] CHARGE-COUPLED IMAGING DEVICE HAVING ELECTRICAL CONNECTIONS ON THE READOUT REGISTER SIDE

[75] Inventors: Jan T.J. Bosiers; Bartholomeus G.M.H. Dillen, both of Eindhoven, Netherlands

[73] Assignee: U.S. Philips Corporation, New York, N.Y.

[21] Appl. No.: 855,068

[22] Filed: May 13, 1997

Related U.S. Application Data

[63] Continuation of Ser. No. 602,542, Feb. 20, 1996, abandoned.

[30] Foreign Application Priority Data

Feb. 21, 1995 [EP] European Pat. Off. ............... 95200415

[51] Int. Cl.[6] .............................. H04N 5/335; H04N 9/64
[52] U.S. Cl. .......................... 348/314; 348/249; 348/299; 257/230
[58] Field of Search ..................................... 348/294, 299, 348/311, 314, 315, 316, 317, 319, 320, 321, 322, 323, 324, 241, 248; 257/223, 230, 249, 250; H04N 5/335, 9/64

[56] References Cited

U.S. PATENT DOCUMENTS

| | | | |
|---|---|---|---|
| 4,430,672 | 2/1984 | Berger ...................................... | 358/213 |
| 4,881,249 | 11/1989 | Chautemps et al. ...................... | 377/60 |
| 5,055,667 | 10/1991 | Sayag ................................... | 250/208.1 |
| 5,148,013 | 9/1992 | Yamada ................................. | 250/208.1 |
| 5,210,433 | 5/1993 | Ohsawa et al. ......................... | 257/250 |
| 5,283,451 | 2/1994 | Cazaux ................................... | 257/229 |
| 5,286,990 | 2/1994 | Hynecek ................................. | 257/247 |
| 5,308,970 | 5/1994 | Pool ..................................... | 250/208.1 |
| 5,453,632 | 9/1995 | Hynecek et al. ........................ | 257/247 |

OTHER PUBLICATIONS

"Tektronics Four Quadrant Readout 1024 * 1024 CCD Imager: First Test Results" by Delamere et al, published in Proc. Spie vol. 1071 Optical Senors and Electronic Photography (1989), pp. 197/202.

*Primary Examiner*—Wendy Garber
*Assistant Examiner*—Ngoc-Yen Vu
*Attorney, Agent, or Firm*—Steven R. Biren

[57] ABSTRACT

In charge-coupled imaging devices it is generally necessary to provide zones (12) in the matrix with a contact. These zones may form part, for example, of a mechanism for draining charge, for example as a protection against overexposure. In the case of imaging devices with a horizontal readout register on one side of the matrix, these contacts can be provided on the opposite side. However, it is often desirable or even necessary, as in the case of imaging devices with four-quadrant readout, to provide such contacts on the same side as the horizontal readout register. To this end, a dummy line (14'–17') is provided in accordance with the invention between the matrix and the horizontal readout register (6), said dummy line having an electrode structure which leaves room for contact windows (22) to the zones (12).

6 Claims, 3 Drawing Sheets

CHARGE-COUPLED IMAGING DEVICE HAVING ELECTRICAL CONNECTIONS ON THE READOUT REGISTER SIDE

This application is a continuation of Ser. No. 602,542 filed Feb. 20, 1996 now abandoned.

BACKGROUND OF THE INVENTION

The invention relates to a charge-coupled imaging device comprising a semiconductor body which is provided at a surface with a two-dimensional matrix of photosensitive elements which are arranged in rows and columns and in which, dependent upon the intensity of incident electromagnetic radiation, electric charge is generated which can be transferred in the form of discrete charge packets via a system of parallel transport lines in the form of charge-coupled devices in the column direction towards a readout register in the form of a charge-coupled device for transferring charge packets in a direction parallel to the rows.

Such a device is for example known from the article "Tektronics Four Quadrant Readout 1024 * 1024 CCD Imager: First Test Results" by Delamere et.al., published in Proc. Spie Vol. 1071 Optical Sensors and Electronic Photography (1989), pp. 197/202. In said article a description is given of a CCD imaging device which comprises a number of adjacent vertical CCD-channels which form the matrix of photosensitive elements. The upper side and the lower side of the matrix are each provided with two horizontal readout registers which are each connected to one of 4 output amplifiers. When the device is in operation, in the integration period an image is converted to a pattern of charge packets of charge carriers of a certain type, for example electrons in the case of an n-channel CCD. Subsequently, the charge packets in the various quadrants can be transferred via the vertical channels to the associated horizontal readout register to be read out. The use of four readout registers permits the stored information to be read out very rapidly. This is very important, particularly, yet not exclusively, when the number of photosensitive elements is very large, such as in "Full Frame" imaging devices.

In CCD imaging devices in general, it may be necessary to provide zones in the matrix with an electrical connection to supply or drain current, or to apply a specific voltage. As will be apparent from the description of the drawings given below, this situation occurs when the imaging device must be protected against overexposure (anti-blooming), requiring electric charge generated in the matrix to be drained. In the case of imaging devices which are provided with a horizontal readout register on only one side of the matrix, for example the lower side, such connections can be provided at the upper side of the matrix where there is no horizontal readout register. Of course, in this case the same problems as described above with respect to the four-quadrant imaging device would occur if it were necessary, for example, to provide such electrical connections at the lower side.

SUMMARY OF THE INVENTION

It is an object of the invention to provide, inter alia, a charge-coupled imaging device in which zones, which form part of the matrix, are provided with electrical connections near a horizontal readout register. The invention further aims at providing a CCD imaging device comprising horizontal readout registers on either side of the matrix, said imaging device comprising integrated means for protecting it against overexposure.

A charge-coupled imaging device of the type described in the opening paragraph is characterized in accordance with the invention, in that the readout register and the nearest row of photosensitive elements, which forms part of the matrix of photosensitive elements, are separated from each other by an intermediate region of the semiconductor body in which one or more surface zones are situated which extend from this intermediate region between the columns of the matrix of photosensitive elements, and which are provided with an electrical connection at the area of said intermediate region. Said intermediate region may comprise one or more dummy lines in which no active video information is generated. The gate electrodes above these dummy lines can be shaped so as to enable said zones to be provided with contacts. As these connections are situated entirely outside the photosensitive matrix, the sensitivity of the imaging device is not adversely affected.

The invention can advantageously be used in imaging devices comprising a readout register on only one side of the matrix. Particular advantages are obtained in an imaging device in accordance with the invention, which is characterized in that, apart from said first readout register, the device comprises a second readout register in the form of a charge-coupled device which extends parallel to the first readout register and which is located on the side of the matrix of photosensitive elements which is opposite the first readout register.

An important embodiment of an imaging device in accordance with the invention is characterized in that the zone or zones which are provided with an electrical connection in the intermediate region form part of means for draining excess charge during operation of the device to preclude, in particular, yet not exclusively, blooming as a result of overexposure. Unlike, for example, the above-described four-quadrant imaging device, the use of anti-blooming means in conventional CCD imaging devices comprising a readout register on only one side of the matrix and connections for draining charges on the opposite side is generally known. In a form of anti-blooming which is known per se and which is also referred to as lateral anti-blooming, the excess-charge carriers (electrons for an n-channel device and holes for a p-channel device) are drained via surface zones (of the n-type for an n-channel device and of the p-type for a p-channel device) which extend between the columns in the matrix. This form of anti-blooming can advantageously be used in an imaging device in accordance with the invention in which the zones which are contacted in said intermediate region are formed by the drain zones for the generated excess-charge carriers. The other type of charge carriers, i.e. for example the generated holes in the case of an n-channel device, can be drained, in this embodiment, via the substrate which is a p-type substrate in this example.

A further embodiment of a charge-coupled imaging device in accordance with the invention is characterized in that the charge-coupled devices are of the buried-channel type and comprise a charge-transport channel in the form of regions of a first conductivity type which are situated at or at least near the surface and which are separated from an underlying region of the first conductivity type, hereinafter referred to as substrate region, which forms a drain for excess-charge carriers in the case of overexposure, by an intermediate zone of the second conductivity type, which is in opposition to the first conductivity type, and which extends between the charge-coupled devices of the matrix of photosensitive elements up to the surface of the semiconductor body and which forms the above-mentioned zone which is provided with an electrical connection at the area of the intermediate region. In this form of anti-blooming, hereinafter also referred to as vertical anti-blooming, the excess-charge carriers are drained via the substrate, which is of the n-type in the case of an n-channel device and of the p-type in the case of a p-channel device. The substrate cannot only be used for anti-blooming but also for charge-reset; in the latter case all the charge present in the matrix is drained via the substrate, for example to set the exposure time. The charge carriers of the other type, for example the holes in the case of an n-channel device, are drained, in this embodiment, via the p-type zone or zones between the n-type substrate and the n-type CCD-channels and between individual CCD-channels.

In the last embodiment, also in the absence of overexposure an electric current runs through the electrical connection. This current is representative of the total flux of absorbed radiation. A further embodiment of a charge-coupled imaging device in accordance with the invention is characterized in that said zone is connected, via the electrical connection, to means for determining the photocurrent which is generated in the matrix of photosensitive elements during operation of the device. The signal obtained enables, for example, a shutter or diaphragm of the camera to be set.

These and other aspects of the invention will be apparent from and elucidated with reference to the embodiments described hereinafter.

It is noted that the Figures are purely schematic and that the various parts of the device are not drawn to scale.

The invention will hereinbelow be explained in greater detail by means of an imaging device with four-quadrant readout. It will be apparent from the description of the device that the invention is not limited thereto, and that it can advantageously be used, in general, in any type of CCD imaging device if it is necessary or desirable to provide semiconductor zones in the matrix with contacts on the side of a horizontal readout register.

Figure 1:
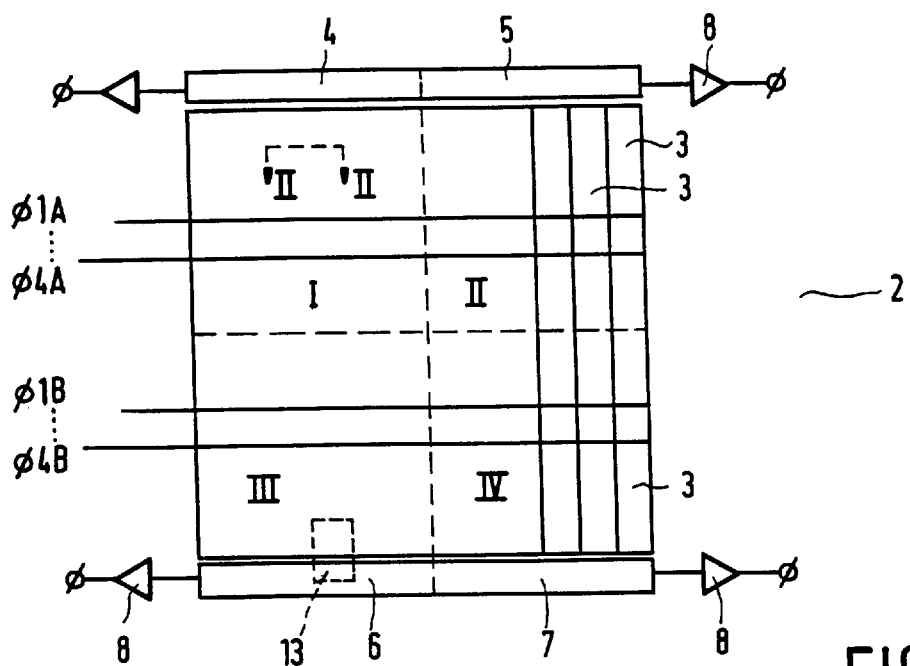
FIG. 1 shows a diagram of a CCD imaging device with four-quadrant readout in accordance with the invention.
Figure 2:
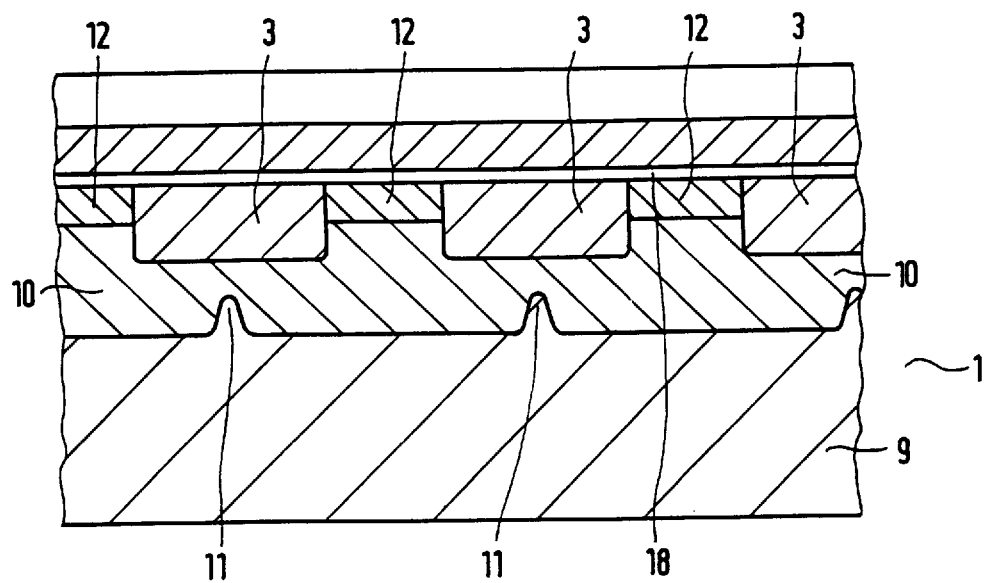
FIG. 2 is a sectional view of this device taken on the line II—II.

The imaging device is provided in a semiconductor body 1 of silicon and comprises a matrix 2 of photosensitive elements which are arranged in rows and columns and which are formed at or near the surface of said body 1. In this example, the photosensitive elements are formed by a large number of juxtaposed charge-coupled devices 3 extending in the vertical direction or in the column direction in the diagram of FIG. 1. For clarity, FIG. 1 shows only a few of these CCD-channels. FIG. 2 is a sectional view transverse to the charge-transport direction of a part of the device having three CCD-channels 3. Consequently, in this example said CCDs 3 do not only form vertical transport lines but also define the location of the photosensitive elements or pixels by means of the applied voltages. In other embodiments, the pixels are formed by individual photodiodes, which are arranged in rows and columns, and the CCDs only form transport lines to transfer the generated charge packets in the vertical direction to a horizontal readout register.

The device comprises four horizontal readout registers 4, 5, 6 and 7, which are arranged at the end faces of the vertical registers 3. The registers 4–7 are used to read out the quadrants I, II, III and IV, respectively, of the matrix. The boundaries between the various quadrants are indicated by broken lines in FIG. 1. Each of the readout registers 4–7 is provided with an output amplifier 8, which may be of conventional construction, which will not be described herein.

The surface of the matrix 2 is covered with electrodes or gates a number of which are shown in FIG. 1, respectively for the quadrants I and II and for the quadrants III and IV. By applying suitable clock voltages $\phi_{1A}$–$\phi_{4A}$ to these electrodes for the quadrants I and II in the upper segment of the matrix, and clock voltages $\phi_{1B}$–$\phi_{4B}$ for the quadrants III and IV in the lower segment of the matrix, the charge packets in the upper segment can be transferred to the registers 4 and 5 and the charge packets in the lower segment can be transferred to the registers 6 and 7. By virtue of the four-fold readout, the matrix can be read out in a relatively short period of time, even when it is very large, such as in the case of "Full-Frame" imaging devices, for example, for ESP applications or in the case of imaging devices, for example, in X-ray scanners for medical applications.

The imaging device is protected against overexposure by means of so-called vertical anti-blooming (VAB). This is achieved in this exemplary embodiment, in which an n-type channel device is used by way of example, by a semiconductor device which comprises an n-type substrate 9 which serves as a drain for excess electrons in the case of overexposure. Said substrate 9 is provided at its surface with a deep p-type zone or well 10 which has a relatively low doping level. The charge-coupled devices are of the buried-channel type and they each comprise an n-type zone 3 provided in the p-well. To obtain a potential barrier of suitable magnitude between the CCD-channels 3 and the substrate 9, the doping concentration in the p-well is chosen to be so low that the part of the p-well situated between the zones 3 and the substrate 9 is depleted throughout its thickness during operation of the device. To preclude that the magnitude of said potential barrier is too great for an effective anti-blooming effect, the p-well may be provided with a narrow portion 11, as shown in FIG. 2, below the zones 3. As is known from the relevant literature, the vertical npn configuration described herein cannot only be used to protect the device against overexposure but also for charge-reset, for example to set the exposure time. The charge formed during a first part of the integration period can then be drained by means of a voltage pulse on the substrate and/or the electrodes via the substrate, whereafter only the charge which is formed during the remaining part of the integration period is integrated in the matrix and used as active video information. The p-well 10 is provided with p-type surface zones 12 of higher doping level which separate the n-type channels 3 from each other.

Figure 3:
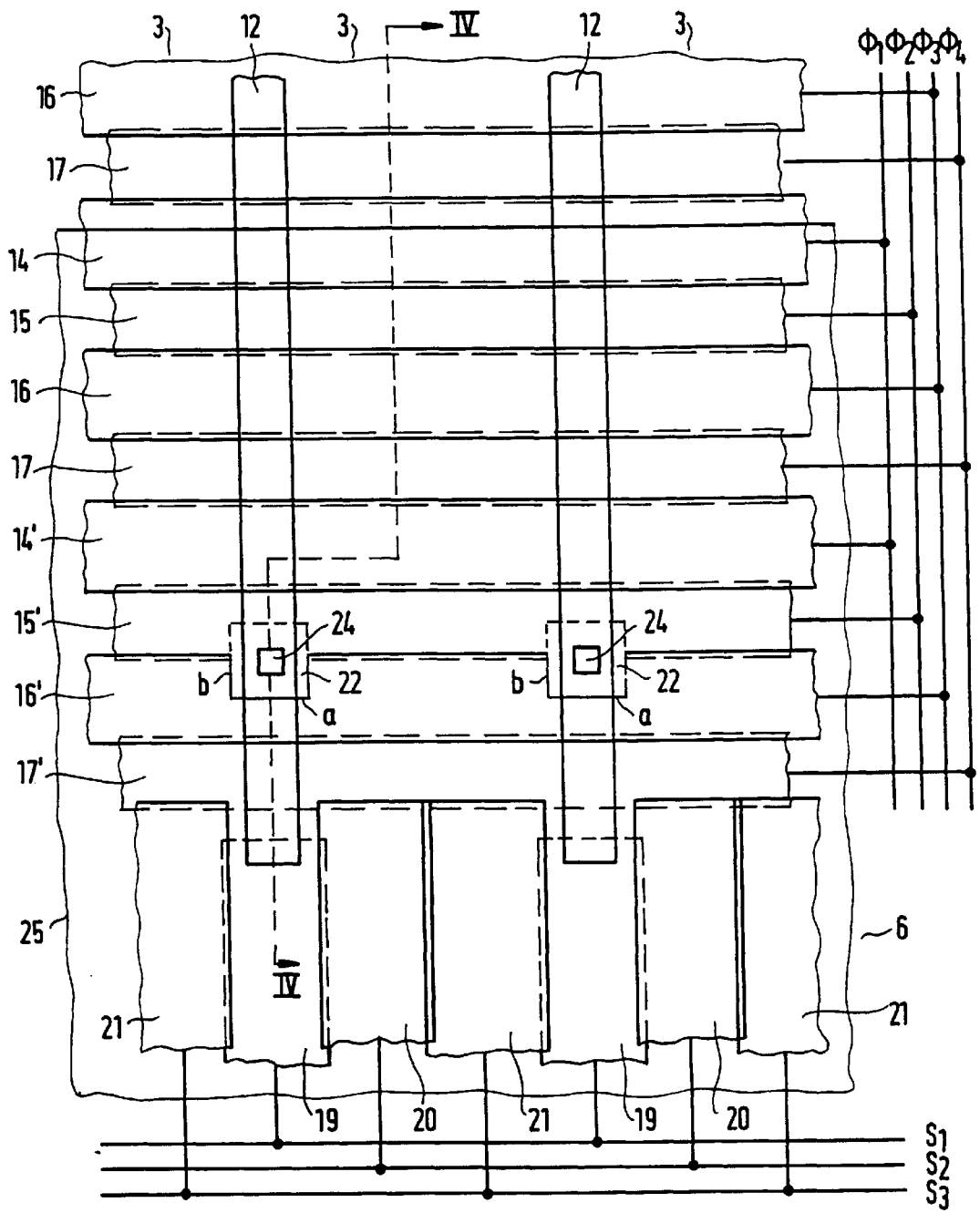
FIG. 3 is a plan view of a part of one of the parallel-series junctions of this device.
Figure 4:
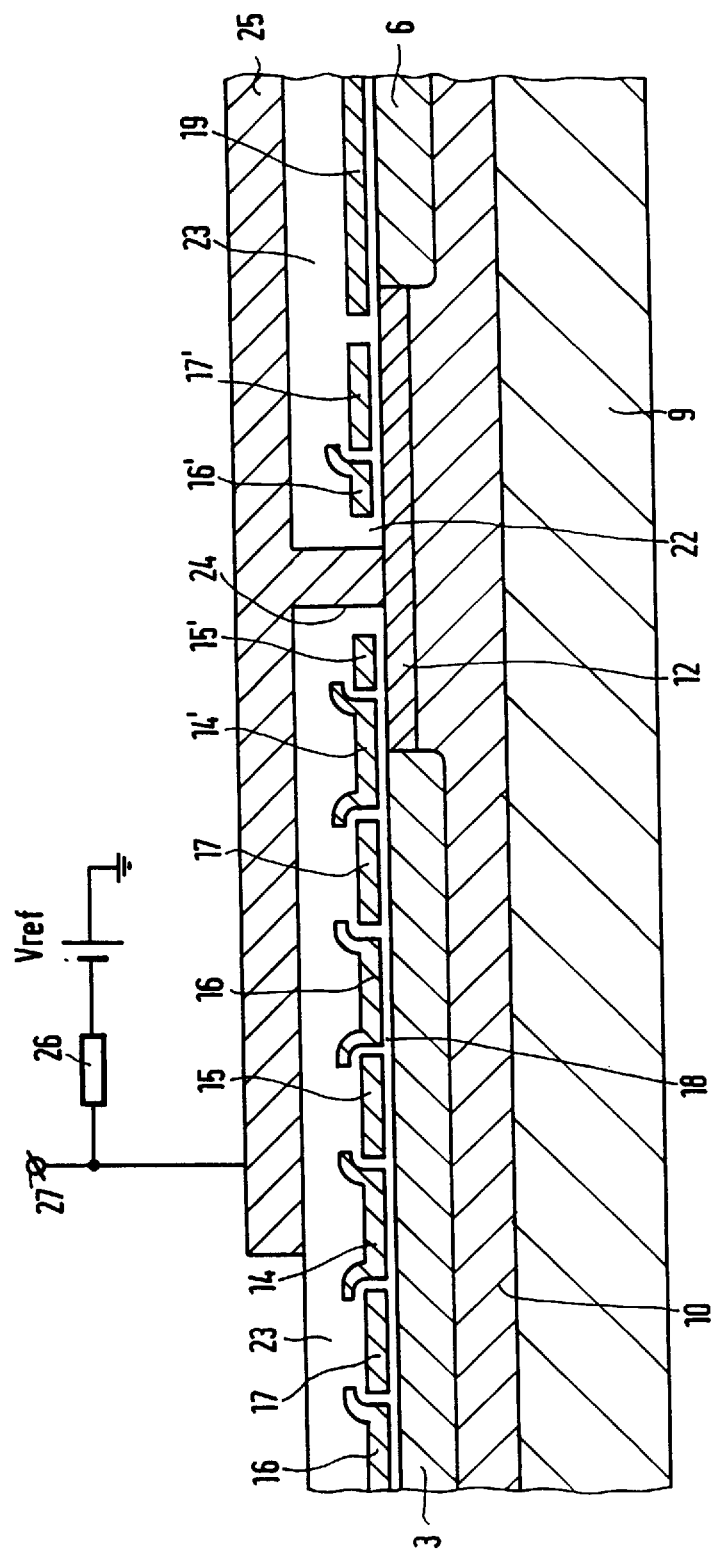
FIG. 4 is a sectional view of the imaging device taken on the line IV—IV in FIG. 3.

Absorption of electromagnetic radiation causes hole-electron pairs to be formed in the semiconductor material. The electrons are stored as video information in potential wells in the matrix or drained via the n-type substrate. The holes are drained via the p-type well 10 and the channel stopper zones 12 provided in said p-type well. The presence of readout registers at both end faces of the matrix makes it impossible to provide the necessary connections in a manner which is customary in conventional imaging devices having a readout register on only one of said end faces of the matrix, in which the electrical connections can be provided on the opposite side of the matrix. The manner in which the zones 10/12 are contacted in the present exemplary embodiment is explained by means of FIGS. 3 and 4. FIG. 3 is a plan view of part 13 in FIG. 1, which is indicated by broken lines, and which comprises the transition between the matrix 2 and the readout register 6. FIG. 4 is a sectional view of FIG. 3 taken on the line IV—IV.

Part 13 shown in FIG. 3 comprises several channels 3 which are separated from each other by channel stopper zones 12. The pick-up matrix is operated as a four-phase CCD having clock voltages $\phi_1$, $\phi_2$, $\phi_3$ and $\phi_4$, which are supplied to the electrodes 14, 15, 16 and 17, respectively, via four clock lines shown on the right-hand side in the Figure. As is shown in FIG. 4, the electrodes 15 and 17 are provided in a first layer of polycrystalline silicon, hereinafter termed poly I, and the electrodes 14 and 16 are provided in a second poly layer, hereinafter termed poly II. The electrodes are isolated from the semiconductor surface by a thin gate dielectric 18, for example silicon oxide. Thus, in this embodiment an imaging element corresponds to four clock electrodes. The effective length of the electrodes 14–17, i.e. the dimension of the electrodes parallel to the charge-transfer direction, is for example 3 $\mu$m.

The horizontal readout register 6 is formed, for example, by a three-phase CCD with a succession of three electrodes 19, 20 and 21 to which the clock voltages $S_1$, $S_2$, and $S_3$, respectively, are supplied. As is shown in FIG. 3, the device is dimensioned so that the pitch in the horizontal direction in the pick-up matrix corresponds to three electrodes of the horizontal register 6, the center lines of the channel stopper zones 12 substantially coinciding with the center lines of the electrodes 19. The electrodes 19 and 20 can be provided in the same poly layers as the electrodes 14–17, i.e. in the layers poly I and poly II, respectively. The electrodes 21 can be manufactured in a third poly layer, termed poly layer III.

The device, including the gate electrodes, is covered by a glass layer 23. To provide each of the channel stopper zones 12 with an electrical connection, an extra line, hereinafter termed dummy line whose corresponding electrodes bear the reference numerals 14', 15', 16'and 17', is provided between the last row of imaging elements 14–17 of the matrix and the horizontal readout register 6. The dummy row forms an intermediate region between the matrix 2 and the readout register 6 at the area where the zones 12 are provided with an electrical connection. For this purpose, the electrodes 15' and 16' are provided with recesses 22 at the area where said electrodes intersect the zones 12, said recesses having a width a, for example, of 3 $\mu$m and a height b, for example, of 3 $\mu$m (thus, the height of the recess in each of the electrodes 15' and 16' is approximately 1.5 $\mu$m). The recesses 22 are provided with contact windows 24, for example, of 1 $\mu$m by 1 $\mu$m in the layer 23. These contact windows are shown in FIG. 3 by means of hatching lines. The contact is formed by a metal layer 25, for example, of A1 which is conductively connected to the zones 12 at the location of the apertures 24. A reference potential can be applied to the A1 layer 25 to drain the holes supplied.

The use of the dummy row having the adapted electrode structure described herein enables the zones 12 to be electrically connected and hence vertical anti-blooming to be applied in an imaging device with four-quadrant readout. As is shown in the drawing, the A1 layer 25 projects above the readout register 6 and hence forms a light shield which protects the register 6 against electromagnetic radiation. In this exemplary embodiment, the A1 layer 25 also projects above the matrix row which is nearest to the register 6. The charge which is integrated in this row during operation of the device originates, at least predominantly, from leakage current and can be used as black reference. The drawing shows a situation in which only one row is used as a black reference. In reality a larger number of black reference lines will be used to obtain black-reference values which are as representative as possible of the matrix.

If desired, the current which runs through the A1 layer 25 can be used to get an indication of the overall quantity of radiation which is absorbed in the matrix per unit of time. For this purpose, as shown in FIG. 4, the A1-layer 25 can be connected to a readout member 26, for example a resistor, so that the potential of the output terminal 27 forms a measure of the intensity of the radiation. This signal can be used for various purposes, for example for setting the exposure time or a diaphragm.

In some embodiments it may be sufficient to electrically connect the zones 12 on one side. Preferably, however, the four quadrants are as similar as possible in form so that the zones 12 are provided with an electrical connection on both end faces of the matrix. This has the additional advantage that voltage gradients in the zones 12 due to the resistance of the zones 12 are kept as small as possible.

It will be obvious that the invention is not limited to the above-described exemplary embodiment and that many variations are possible to those skilled in the art. For example, the invention can also be used in imaging devices with lateral anti-blooming in which a p-type substrate can be used instead of an n-type substrate. The holes can then be drained via the substrate. The excess electrons can be drained via n-type surface zones which are provided between the CCD-channels 3, and which are separated from said channels by p-type channel stopper zones. In this case, the A1-layer 25 forms the electrical connection for these n-type drain zones.

In the exemplary embodiment described with reference to the drawing, the photosensitive elements are formed by the vertical CCD-channels in which the electric charge is generated, integrated in the integration period and transferred to the readout registers. The invention is not limited thereto and can also advantageously be used in imaging devices of the interline type in which the vertical CCD-lines are separated by columns of photodiodes in which the generation and integration of photocurrent takes place and in which the CCD lines only serve for charge transfer.

We claim:

1. Charge-coupled imaging device comprising a semiconductor body which is provided at a surface with a two-dimensional matrix of photosensitive elements which are arranged in rows and columns and in which, dependent upon the intensity of incident electromagnetic radiation, electric charge is generated which can be transferred in the form of discrete charge packets via a system of parallel transport lines in the form of charge-coupled devices in the column direction towards a readout register in the form of a charge-coupled device for transferring charge packets in a direction parallel to the rows, characterized in that the readout register and the nearest row of photosensitive elements, which forms part of the matrix of photosensitive elements, are separated from each other by an intermediate region of the semiconductor body comprising a dummy line in which one or more surface zones are situated which extend from this intermediate region between the columns of the matrix of photosensitive elements, and which are provided with an electrical connection at the area of said intermediate region comprising a contact between the one or more surface zones and a conductive track a provided on top of and electrically isolated from a plurality of electrodes associated with said dummy line, the plurality of electrodes associated with said dummy line being configured to permit passage of said electrical connection.

2. Charge-coupled imaging device as claimed in claim 1, characterized in that, apart from said readout register, the device comprises a second readout register in the form of a charge-coupled device which extends parallel to the first readout register and which is located on the side of the matrix of photosensitive elements which is opposite the first readout register.

3. Charge-coupled imaging device as claimed in claim 2, characterized in that the zone or zones which are provided with the electrical connection in the intermediate region form part of means for draining excess charge during operation of the device to preclude, in particular blooming as a result of overexposure.

4. Charge-coupled imaging device as claimed in claim 1, characterized in that the zone or zones which are provided with the electrical connection in the intermediate region form part of means for draining excess charge during operation of the device to preclude, in particular blooming as a result of overexposure.

5. Charge-coupled imaging device as claimed in claim 4, characterized in that the charge-coupled devices are of the buried-channel type and comprise a charge-transport channel in the form of regions of a first conductivity type which are situated at or at least near the surface and which are separated from an underlying region of the first conductivity type, hereinafter referred to as substrate region, which forms a drain for excess-charge carriers in the case of overexposure, by an intermediate zone of a second conductivity type, which is in opposition to the first conductivity type, and which extends between the charge-coupled devices of the matrix of photosensitive elements up to the surface of the semiconductor body and which forms the above-mentioned zone which is provided with the electrical connection at the area of the intermediate region.

6. Charge-coupled imaging device as claimed in claim 5, characterized in that said zone is connected, via the electrical connection, to means for determining the photocurrent which is generated in the matrix of photosensitive elements during operation of the device.

* * * * *